(12) United States Patent
Iwasa

(10) Patent No.: US 6,541,335 B2
(45) Date of Patent: Apr. 1, 2003

(54) SEMICONDUCTOR DEVICE AND METHOD FOR MANUFACTURING THE SAME

(75) Inventor: Shinya Iwasa, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/956,464

(22) Filed: Sep. 20, 2001

(65) Prior Publication Data

US 2002/0013026 A1 Jan. 31, 2002

Related U.S. Application Data

(62) Division of application No. 09/504,432, filed on Feb. 15, 2000, now Pat. No. 6,313,497.

(30) Foreign Application Priority Data

Feb. 15, 1999 (JP) ............................................ 11-036544

(51) Int. Cl.[7] ......................................... H01L 21/8242
(52) U.S. Cl. ....................... 438/243; 438/239; 438/244; 438/253
(58) Field of Search ................................. 438/238, 239, 438/243, 244, 253

(56) References Cited

U.S. PATENT DOCUMENTS

| 5,689,126 A | * | 11/1997 | Takaishi | 257/306 |
| 5,858,831 A | | 1/1999 | Sung | 438/241 |
| 5,895,239 A | | 4/1999 | Jeng et al. | 438/239 |
| 5,913,150 A | * | 6/1999 | Takaishi | 438/782 |
| 6,180,448 B1 | * | 1/2001 | Lee | 438/253 |
| 6,194,758 B1 | * | 2/2001 | Tanaka et al. | 257/309 |

FOREIGN PATENT DOCUMENTS

| JP | A 8-222709 | 8/1996 |
| JP | A 9-246492 | 9/1997 |
| JP | A 10-2238863 | 8/1998 |
| JP | A 11-26715 | 1/1999 |
| JP | A 11-186522 | 7/1999 |
| JP | A 2000-22104 | 1/2000 |

* cited by examiner

Primary Examiner—Trung Dang
(74) Attorney, Agent, or Firm—Young & Thompson

(57) ABSTRACT

A semiconductor device has such a configuration that a contact hole is formed in a fourth inter-layer insulator film which covers an upper electrode of a capacitor, to expose part of the upper electrode; and below the contact hole, a trench covered by a capacitive insulator film formed in a trench is formed larger than the contact hole in width, to have therein a polycrystalline silicon film which constitutes the upper electrode.

4 Claims, 9 Drawing Sheets

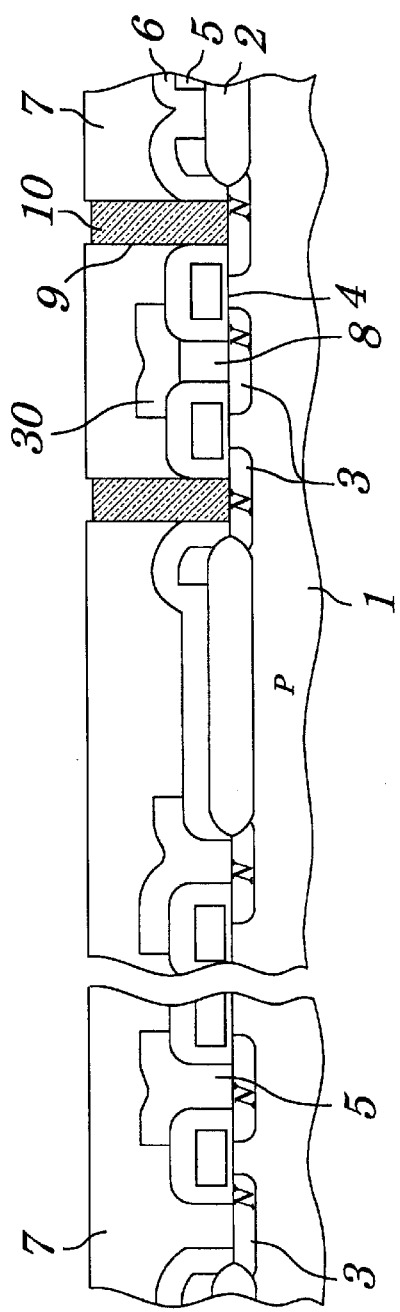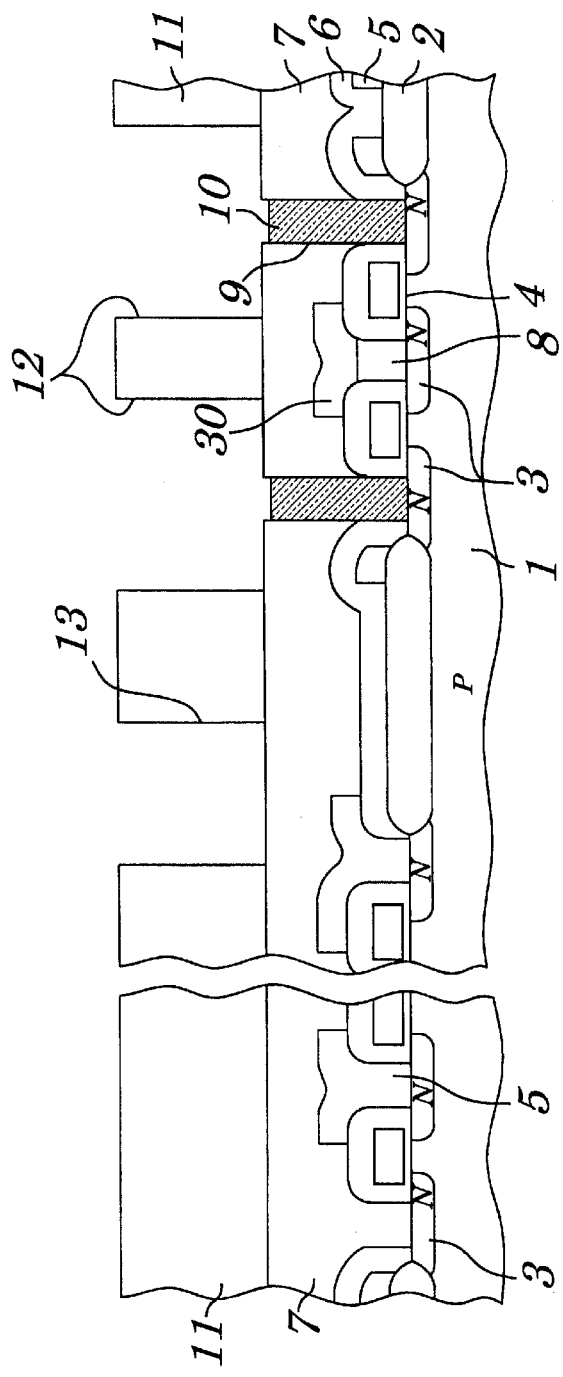
FIG.3A
FIG.3B

SEMICONDUCTOR DEVICE AND METHOD FOR MANUFACTURING THE SAME

CROSS-REFERENCE TO RELATED APPLICATIONS

This application is a division of application Ser. No. 09/504,432, filed Feb. 15, 2000 now U.S. Pat. No. 6,313,497.

BACKGROUND OF THE INVENTION

1. Field of the Invention

The present invention relates to a semiconductor device and a method for manufacturing the same and more particularly to a semiconductor device intended to reduce and stabilize the wiring contact resistance and a method for manufacturing the same.

2. Description of the Related Art

Large scale integrations (LSIs) known as representing semiconductor devices are roughly classified into memory devices and logic devices, the former of which are particularly remarkable in development with recent improvements in semiconductor manufacturing technologies. The memory devices may be further classified into Dynamic Random Access Memories (RAMs) and Static Random Access Memories (SRAMs), both of which are in large part comprised of Metal Oxide Semiconductor (MOS) transistors, which are excellent in integration density. Also, a DRAM may enjoy the above-mentioned merits in terms of integration density as compared to an SRAM, to reduce the manufacturing cost, thus finding wider applications in various storage systems including information-related ones.

A DRAM as a semiconductor device uses a capacitor as the information-storing capacitive element in a manner that presence of charge in the capacitor determines information stored, so that as the device is reduced in size due to improved fine patterning technologies, the area occupied by each capacitor formed in a semiconductor substrate is restricted. To solve this problem, it is necessary to increase the capacitance of each capacitor. If that capacitance is not enough to store information, the relevant device is liable to malfunction due to external noise signal etc., thus giving rise to an error represented by a soft error.

As a structure of the capacitor intended to increase its capacitance by the above-mentioned restricted area of its own, an inner wall-type cylindrical structure is known. FIG. 8 is a cross-sectional view showing a conventional semiconductor device (first conventional embodiment) having such an inner wall-type cylindrical structure. The semiconductor device, as shown in the figure, has such a configuration that an n-type diffusion region 53, surrounded by a device-isolating insulator film 52 consisting of a field oxide film, is formed therein which selectively has a source or drain region in an active region of for example a p-type silicon substrate 51, so that between the regions 53 is provided via a gate oxide film 54 a gate electrode 55, which is in turn covered with a first inter-layer insulator film 56. Moreover, a second inter-layer insulator film 57 is formed in such a manner as to cover the whole surface, in which a bit contact 58 is buried to be connected to one diffusion region 53 with the other diffusion region 53 being connected with a conducting plug 60 buried in a contact hole 59 formed in the first insulator film 57.

A third inter-layer insulator film 61 is formed covering the whole surface, in which is formed a contact hole 62 to expose the conducting plug 60, to which is connected an inner wall-type cylindrical capacitor 65. This capacitor 65 consists of a lower electrode (storage electrode) 66 provided at the inner wall and the bottom of the contact hole 62 to be connected to the conducting plug 60, a capacitive insulator film 67 provided to cover this lower electrode 66 and the third inter-layer insulator film 61, and an upper electrode 68 provided to cover this capacitive insulator film 67.

Here, the conducting plug 60, the lower electrode 66, and the upper electrode 68 consist of for example a polycrystalline silicon film. The capacitive insulator film on the other hand consists of a known insulator film such as oxide-nitride-oxide (ONO) film or oxide-nitride (ON) film.

A fourth later-layer insulator film 71 is formed to cover the whole surface, in which is formed a contact hole 72 to expose the upper electrode 68 of the capacitor 65, to which upper electrode 68 is connected via a barrier metal film 73 an upper wiring (contact) 76 consisting of a conducting plug 78 and an aluminum film. This upper electrode 76 is connected to a peripheral circuit. The upper wiring 76 is covered with a reflection-preventing film 77 consisting of a titanium nitride (TiN) film. This reflection-preventing film 77 acts to prevent irregular reflection of a light produced when an aluminum film is patterned to form the upper wiring 76.

The barrier metal layer 73 consists of a titanium film 74 as the lower film and a titanium nitride film 75 as the upper film, thus acting to prevent aluminum constituting the upper wiring 76 from breaking through the diffusion region 53 up to the silicon substrate 51 caused by heat treatment at the time of hydrogen alloying when a contact hole is formed in the diffusion region 53.

The titanium film 74 constituting the lower film of the barrier metal film 73 is formed to suppress stable the contact resistance with a diffusion region (especially p-type diffusion region) when a contact is formed in the diffusion region 53.

In the manufacturing of the above-mentioned semiconductor device, when connecting a contact through the barrier metal film 73 up to the upper electrode 68, the contact hole 72 is formed in the fourth inter-layer insulator film 71 beforehand to form the barrier metal film 73 thereon, in such a manner that the contact hole 72 and the barrier metal film 73 are formed at the same time as other regions which need to be connected electrically. When, for example, the diffusion region 53 in the silicon substrate 51 or the gate electrode 55 thereon needs an electrical connection, a contact hole and a barrier metal film are formed simultaneously to provide an electrical connection to these regions.

However, since in such a case the above-mentioned contact hole 72 is formed relatively shallow as compared to a contact hole to be formed in a thick inter-layer insulator film on the diffusion region 53 or the gate electrode 55, when a barrier metal film is formed at the same time as each of these contact holes, the barrier metal film is formed thickest on the contact hole 72 formed in the thinnest upper electrode 68. When a barrier metal film is formed thinner on the contact hole 72, on the other hand, a barrier metal film formed on the contact hole formed in the deepest diffusion region 53 becomes thinner, which provides a very thin titanium film, which in turn reduces an effect of suppressing the above-mentioned contact resistance low and stable, thus leading to a problem of an increase in the contact resistance of a contact formed in the contact hole. To eliminate this problem, therefore, it is unavoidable to form the barrier metal film 73 relatively thick on the upper electrode 68 of the capacitor 65.

Thus formed barrier metal film 73 undergoes a subsequent heat treatment (annealing) process, during which its component titanium and the underlying upper electrode 68-component polycrystalline silicon film react with each other (silicide reaction), to form titanium silicide. Thus formed titanium silicide acts to give a lower and stable resistance.

FIG. 10 is a cross-sectional view showing a conventional semiconductor device (second conventional embodiment) provided with an inner wall-type cylindrical structured capacitor according to another embodiment. As shown in the figure, in this semiconductor device, a conductive film (break-through preventing film) 79 consisting of a polycrystalline silicon film formed with the gate electrode 55 simultaneously is provided at the first inter-layer insulator film 56 to form the capacitor 65 and subsequently a contact hole 80 which breaks through the upper electrode 68 up to the conductive film 79, in order to form the barrier metal layer 73 on this contact hole 80. The upper electrode 68 of the capacitor 65 is connected with the metal film 73 at part of the side of the batter metal film 73.

Since, in the above-mentioned first conventional semiconductor device, at the contact formed at the upper electrode of the capacitor, the barrier metal-component titanium has a large thickness as compared to the capacitor's upper electrode-component polycrystalline silicon, supply of polycrystalline silicon is liable to go insufficient at the time of silicide reaction to have voids at part of the upper electrode, which leads to a problem of an increase in and instability of the resistance of the contact of a wiring up to the upper electrode through the barrier metal film.

That is, since, as mentioned above, the upper electrode 68 of the capacitor 65 has the barrier metal film formed relatively thick thereon, as shown in FIG. 9A, supply of titanium, which promotes the silicide reaction, is large and, at the same time, the polycrystalline silicon film is thin, so that supply of polycrystalline silicon becomes insufficient at the time of the silicide reaction. When, moreover, the component in the thickness direction of the polycrystalline silicon film is completely eliminated, the silicide reaction proceeds in a lateral direction (arrow direction) of the polycrystalline silicon film as shown in FIG. 9B. If, in this case, supply of polycrystalline silicon cannot catch up with the silicide reaction, part of the polycrystalline silicon film has a void 81. In the worst case, the wiring suffers from poor continuity.

The occurrence of the void in this case is considered to depend on a proportion in area between (titanium silicide/silicon interface) and titanium, so that the void is liable to occur when a relationship of ((area of titanium)>>(area of (titanium silicide/silicon interface)) is established. Therefore, the void occurs in an easier manner as the barrier metal film 73 component titanium increases in thickness.

Since in the above-mentioned second conventional semiconductor device, on the other hand, in contrast to the above-mentioned first conventional embodiment, the relationship of ((area of titanium)>>(area of (titanium silicide/silicon interface)) is not established, the void can be prevented from occurring; however, the conductive film 79 is provided deep in the inter-layer insulator film, thus problematically acting as a restrictive obstruction in layout.

That is, since, in the above-mentioned second conventional embodiment, the presence of the conductive film 79 makes it impossible to form a wiring etc. passing through the relevant region, such a layout-wise restriction cannot be disregarded in a fine-patterned structure. Since also, in this second conventional embodiment, the barrier metal film 73 is connected at its side with the upper electrode 68, it is impossible to form a side-wall insulator film intended to prevent a short circuit between mutually adjacent wirings in a fine-patterned structure, which constitutes another problem.

SUMMARY OF THE INVENTION

In view of the above, it is an object of the present invention to provide a semiconductor device and a method for manufacturing the same intended to reduce and stabilize the contact resistance by suppressing void occurrence, likely at the time of the silicide reaction, at a polycrystalline silicon wiring.

According to a first aspect of the present, there is provided a semiconductor device having such a configuration that in a second insulator film which covers a first polycrystalline silicon film provided in a first insulator film which covers a semiconductor substrate, a first contact hole is formed to expose part of said polycrystalline silicon film, and through said first contact hole, a wiring is connected, via a barrier metal film composed of an underlying titanium film, to said polycrystalline silicon film, wherein a trench which has a width larger than a width of said first contact hole is formed in said first insulator film below said first contact hole and a second polycrystalline silicon film is provided in said trench.

Also, according to a second aspect of the present invention, there is provided a semiconductor device having such a configuration that in a second insulator film which covers a first polycrystalline silicon film provided on a first insulator film which covers a semiconductor substrate, a first contact hole is formed to expose part of said polycrystalline silicon film, a second contact hole having a depth different from a depth of said first contact hole is formed in an insulator film including said first insulator film and said second insulator film in a diffusion region of said semiconductor substrate, and through said first contact hole, a wiring is connected via a barrier metal film composed of an underlying titanium film to said polycrystalline silicon film, wherein a trench which has a width larger than a width of said first contact hole is provided in said insulator film below said first contact hole and a second polycrystalline silicon film is provided in said trench.

In the foregoing first/second aspect, a preferable mode is one wherein a film thickness of a polycrystalline silicon region formed in said trench by said second polycrystalline silicon film is set corresponding to a film thickness of said underlying titanium film of said barrier metal film at a bottom of said first contact hole.

Also, a preferable mode is one wherein said second polycrystalline silicon film is so provided in said trench as to be fully buried therein.

Also, a preferable mode is one wherein said second polycrystalline silicon film is not fully buried in said trench and said first contact hole is so provided as to approximately reach a bottom of said trench.

Furthermore, a preferable mode is one wherein a side-wall insulator film is provided on a side wall of said first contact hole and a side wall of said second contact hole.

According to a third aspect of the present, there is provided a semiconductor device having such a configuration that a capacitor is formed so as to be electrically connected to one diffusion region in a semiconductor substrate and includes a lower electrode provided in a second contact hole formed in a first insulator film on said semiconductor substrate, a capacitive insulator film provided on said lower electrode and said first insulator film, and a polycrystalline silicon-made upper electrode provided on said capacitive insulator film, a first contact hole is formed in a second insulator film which covers said upper electrode, to expose part of said upper electrode, and through said first contact hole, a wiring is connected via a barrier metal film composed of an underlying titanium film to said upper electrode, wherein a trench which has a width larger than a width of said first contact hole is provided in said first insulator film below said first contact hole and a polycrystalline silicon film which constitutes a dummy capacitor is provided in said trench.

In the foregoing third aspect, a preferable mode is one wherein a third contact hole which differs from said first contact hole in depth is formed in an insulator film which includes said first insulator film and said second insulator film and which covers said semiconductor substrate, in a diffusion region of said semiconductor substrate.

Also, a preferable mode is one wherein a film thickness of a polycrystalline silicon region formed in said trench by said polycrystalline silicon film is set corresponding to a film thickness of said underlying titanium film of said barrier metal film at a bottom of said first contact hole.

Also, a preferable mode is one wherein said polycrystalline silicon film is so provided as to be fully buried in said trench.

Also, a preferable mode is one wherein said polycrystalline silicon film is not fully buried in said trench and said first contact hole is so provided as to approximately reach a bottom of said trench.

Also, a preferable mode is one wherein a side-wall insulator film is provided on a side wall of said first contact hole and said second contact hole.

According to a fourth aspect, there is provided a method of manufacturing a semiconductor device, including the steps of:

forming a diffusion region in a semiconductor substrate and then connecting a conducting plug to said diffusion region, to form a memory-cell selecting transistor;

forming a first insulator film so as to cover said conducting plug and then forming a second contact hole in said first insulator film so as to expose said conducting plug and, at the same time, forming a trench so as not to expose said plug;

forming a conductive film in said second contact hole and said trench simultaneously, to constitute a lower electrode of a capacitor and a lower electrode of a dummy capacitor;

forming capacitive insulator film so as to cover both of said electrodes and then forming an upper electrode made of polycrystalline silicon on said capacitive insulator film to form a capacitor and a dummy capacitor;

forming a second insulator film so as to cover said upper electrode of said capacitor and then forming a first contact hole smaller in width than a second trench covered with said capacitive insulator film formed in said trench, in said second insulator film so as to expose said upper electrode of said dummy capacitor and, at the same time, forming a third contact hole which differs in depth from said first contact hole, in an insulator film which includes said first insulator film and said second insulator film;

forming a barrier metal film which has an underlying film made of titanium, in such a way that a titanium film which has a film thickness corresponding to a film thickness of a polycrystalline silicon region formed in said trench by polycrystalline silicon of said upper electrode is formed at a bottom of said first contact hole; and conducting heat treatment of reacting titanium of said underlying film of said barrier metal film and polycrystalline silicon of said upper electrode.

A preferable mode is one wherein in said capacitor forming step, said upper electrode is formed in such a way that polycrystalline silicon of said upper electrode is fully buried in said trench.

Also, a preferable mode is one wherein in said capacitor-forming step, said upper electrode is formed in such a way that polycrystalline silicon is not fully buried in said trench and, at the same time, said first contact hole is so formed as to reach a bottom of said trench.

Also, a preferable mode is one that wherein further including a step of forming a side-wall insulator film on said first side wall and said third wall after said contact hole-forming step.

With the above configurations, a contact hole is formed in an insulator film which covers a polycrystalline silicon film, to expose part of this polycrystalline silicon film, in an insulator film below which contact hole is formed a trench larger than the contact hole in width, in which trench is provided a polycrystalline silicon film, so that there is no insufficiency in supply of polycrystalline silicon at the time of the silicide reaction between polycrystalline silicon and titanium of the barrier metal film.

Also, a contact hole is formed in an insulator film which covers a polycrystalline silicon film, to expose part of this polycrystalline silicon film, in an insulator film below which contact hole is formed a trench larger than the contact hole in width, in which trench is provided a polycrystalline silicon film, so that even if the contact hole is over-etched, the polycrystalline silicon film on the insulator film is not separated from the polycrystalline silicon film in the trench, thus giving rise to no problem in an electrical connection between a wiring and the polycrystalline silicon film when a side-wall film is formed on the side walls of the contact hole.

Therefore, the present invention can suppress the occurrence of voids which is likely at a polycrystalline silicon wiring at the time of the silicide reaction, thus reducing and stabilizing the contact resistance.

BRIEF DESCRIPTION OF THE DRAWINGS

The above and other objects, advantages and features of the present invention will be more apparent from the following description taken in conjunction with the accompanying drawings in which:

FIG. 3 is a flow diagram showing steps in order for manufacturing the semiconductor device;

DETAILED DESCRIPTION OF THE PREFERRED EMBODIMENTS

The best modes for carrying out the present invention will be described in detail using embodiments of the present invention with reference to the accompanying drawings.

First Embodiment

Figure 1:
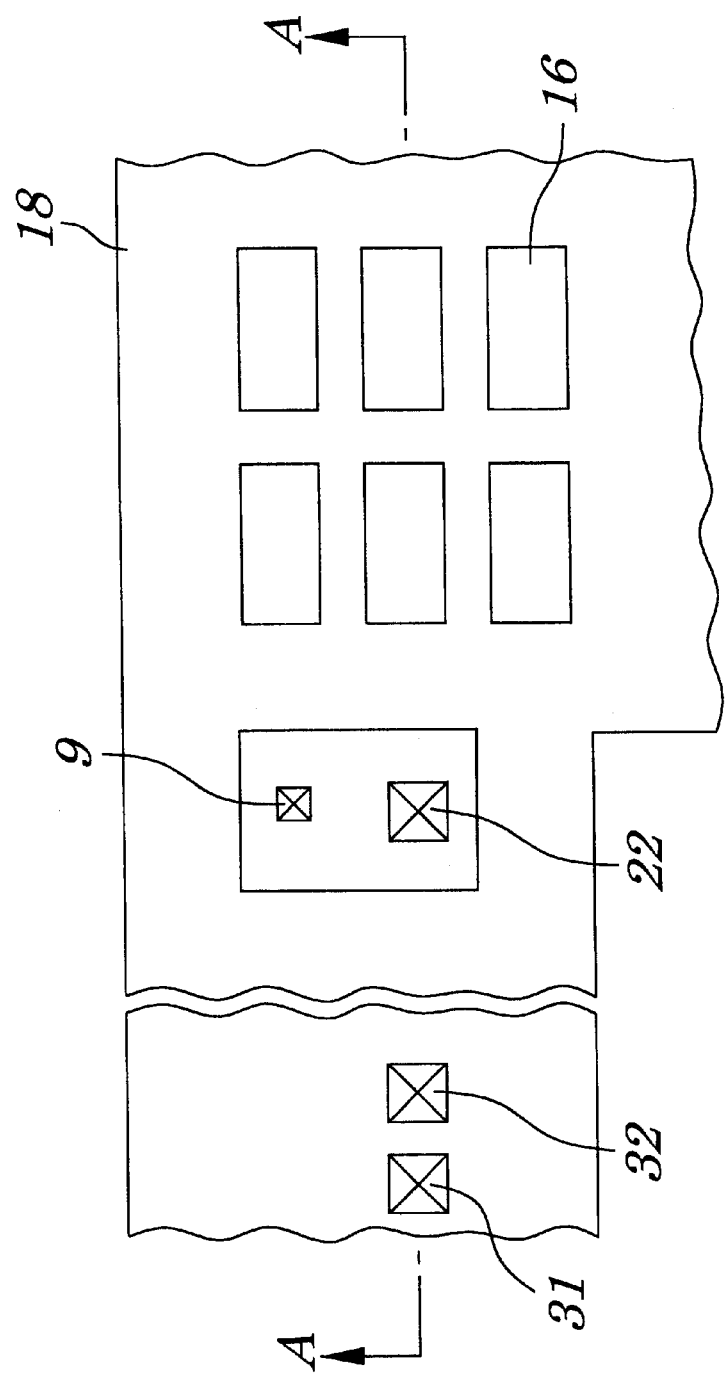
FIG. 1 is a plan view showing a configuration of a semiconductor of a first embodiment of the present invention.
Figure 2:
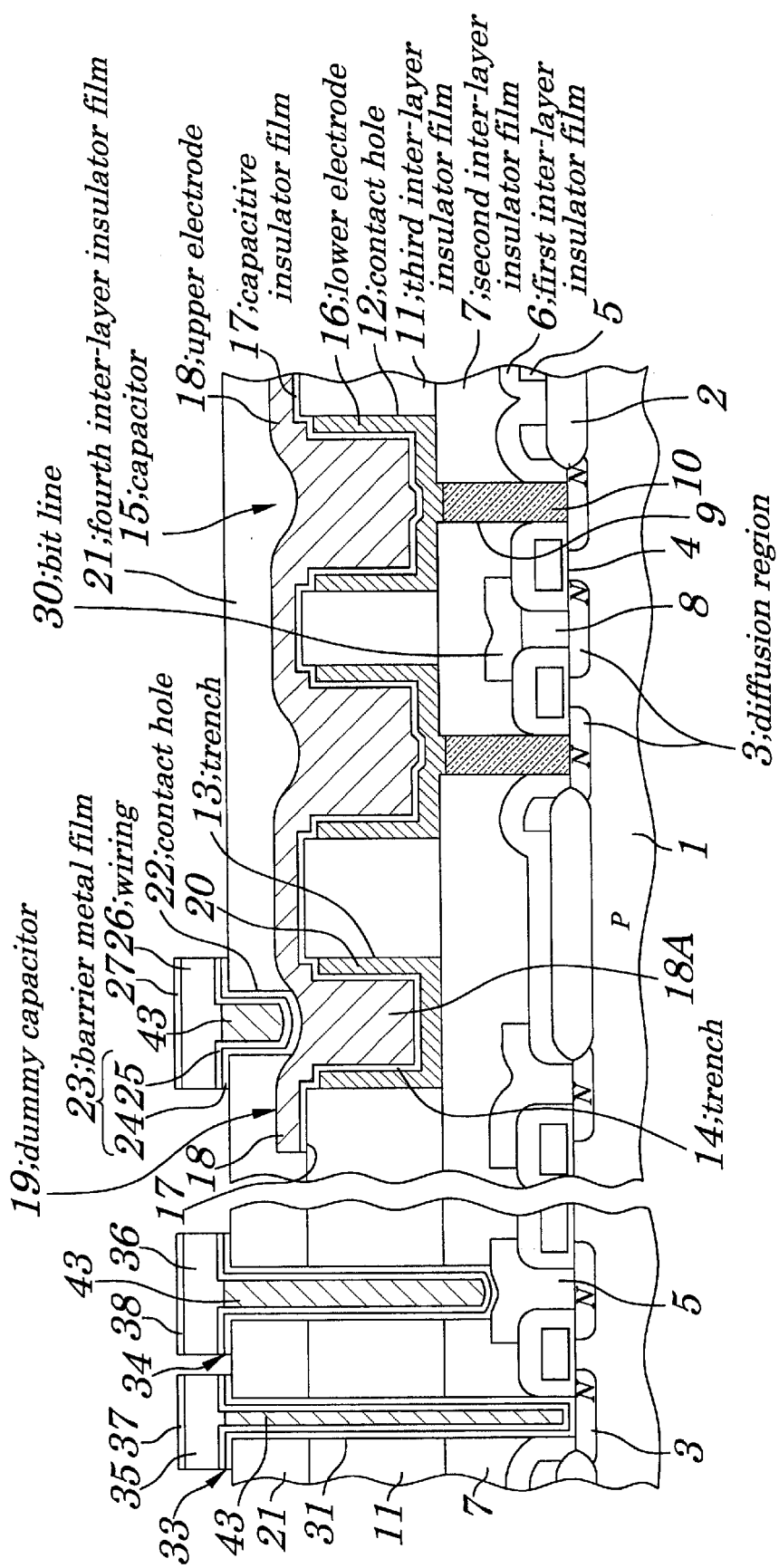
FIG. 2 is a cross-sectional view taken along line A—A of FIG. 1.

As shown in FIGS. 1 and 2, this exemplary semiconductor device has such a configuration that an n-type diffusion region 3, surrounded by an element-isolating insulator film 2 consisting of a 200 to 300 nm-thick field oxide film, is formed therein which selectively constitutes a source or drain region in an active region of for example a p-type silicon substrate 1, in such a way that between the regions 3 is provided via a gate oxide film 4 a 200 to 300 nm-thick polycrystalline gate electrode 5, which is covered with a first inter-layer insulator film 6 consisting of a 100 to 150 nm-thick silicon oxide film. Each diffusion region 3 is connected with a bit contact 8 consisting of a polycrystalline silicon film, to which is connected a bit line 30, which is buried in a second inter-layer insulator film 7 consisting of a 400 to 500 nm-thick boro-phospho silicate glass (BPSG) formed all over the surface, in which is formed a contact hole 9, into which is buried a conducting plug 10, which is connected to the diffusion region 3.

A third inter-layer insulator film 11 consisting of a 0.8 to 1.5 μm-thick silicon oxide film or BPSG film is formed so as to cover the whole surface, in which is formed a contact hole 12 having a width of 0.5 to 1.0 μm and a depth of 0.6 to 1.1 μm, to expose the conducting plug 10, to which is connected an inner wall-type cylindrical-structured capacitor 15.

This capacitor 15 is composed of: a lower electrode 16 made of a 0.05 to 0.1 μm-thick polycrystalline silicon film which is provided on the inner wall and the bottom of the contact hole 12 and which is connected to the conducting plug 10; a capacitive insulator film 17 consisting of a 6 to 8 nm-thick ONO or ON film which is provided so as to cover this lower electrode 16 and the third inter-layer insulator film 11; and an upper electrode 18 made of a 0.15 to 0.3 μm-thick polycrystalline film which is provided so as to cover this capacitive insulator film 17.

In the third inter-layer insulator film 11 is formed a trench 13 adjacent to the contact hole 12 having approximately the same depth as the contact hole 12, in which trench 13 is formed a dummy capacitor 19. That is, in the trench 13, at the same time as the lower electrode 16 of the capacitor 15 is formed, a 0.05 to 0.1 μm-thick polycrystalline film 20 made of the same conductive material as the lower electrode 16 is formed, so as to form a dummy capacitor 19 together with the capacitive insulator film 17 and the upper electrode 18, both of which have been elongated up to this polycrystalline silicon film 20. This dummy capacitor 19, as mentioned later, acts to suppress the occurrence of voids which is likely in the upper electrode 18 when a wiring is connected via a barrier metal film 23 to the upper electrode 18 of each true capacitor 15 connected to the conducting plug 10.

A fourth inter-layer insulator film 21 consisting of a 0.35 to 0.55 μm-thick silicon oxide or BPSG film is formed so as to cover the whole surface, in which is formed a contact hole 22 with a width of 0.35 to 0.55 μm and a depth of 0.3 to 0.6 μm so as to expose the upper electrode 18 of the capacitor 15. This contact hole 22 is formed above the above-mentioned trench 13 and has a width less than that of the trench 14 covered by the capacitive insulator film formed in the trench 13. This is so formed, as mentioned above, in order to suppress the occurrence of voids likely at the upper electrode 18, thus bringing about reduced and stabilized resistance.

Also, other positions of the inter-layer insulator film in the semiconductor substrate have a contact hole 31 formed in the diffusion region 3 in order to provide an electrical connection and a contact hole 32 formed in the gate electrode 5 in order to provide an electrical connection. The contact hole 31 is actually formed breaking through the fourth inter-layer insulator film 21, the third inter-layer insulator film 11, the second inter-layer insulator film 7, and the first inter-layer insulator film 6 so as to expose the diffusion region 3. The contact hole 32, on the other hand, is actually formed breaking through the fourth inter-layer insulator film 21, the third inter-layer insulator film 11, the second inter-layer insulator film 7, and the first inter-layer insulator film 6 so as to reach the gate electrode 5. These contact holes 31 and 32 are formed at the same time as the above-mentioned contact hole 22. Therefore, the contact hole 31 is formed deepest at the largest total film thickness of these inter-layer insulator films; and the contact hole 22 is formed shallowest at the smallest total film thickness of these inter-layer insulator films.

Through the contact hole 22, a tungsten-made conducting plug 43 and a wiring 26 consisting of 250 to 450 nm-thick aluminum film are connected to the upper electrode 18 via the barrier metal film 23 consisting of a stack film composed of an 80 to 150 nm-thick titanium film 24 and a 70 to 150 nm-thick titanium nitride film 25.

The wiring 26 is covered with a reflection preventing film 27 consisting of a 25 to 30 nm-thick titanium nitride film. Likewise, the above-mentioned contact holes 31 and 32 are respectively provided, via barrier metal films 33 and 34, with tungsten-made conducting plug 43, wirings 35 and 36, and reflection preventing films 37 and 38.

The thickness of the polycrystalline film which constitutes the upper electrode 18 is desired at a value which corresponds to a film thickness of the bottom of the contact hole 22 formed in the titanium film 24 which is in contact with the upper electrode 18 as the barrier metal film 23 and is also arranged so that the upper electrode 18 may not run short of polycrystalline silicon at the time of the silicide reaction between its component polycrystalline silicon film and the titanium film 24. Specifically, in the trench 13 in which the dummy capacitor 19 is formed, a polycrystalline silicon film 18A which constitutes the upper electrode 18 is buried to a sufficient film thickness, so that the device does not run short of polycrystalline silicon at the time of the silicide reaction between titanium and polycrystalline silicon. With this, therefore, it is possible to suppress the occurrence of voids which is likely at the upper electrode 19.

Also, since the width of the trench 14 covered with the capacitive insulator film 12 formed in the trench 13 in which the dummy capacitor 19 is formed is made larger than that of the contact hole 22, even if the contact hole 22 is so over-etched as to reach the height of the capacitive insulator film 12, the upper electrode 18 above the third inter-layer insulator film 11 is not separated from the polycrystalline silicon region 18A formed in the trench 14, to prevent poor continuity of the wiring, thus obtaining the same effects of suppressing the occurrence of voids likely at the upper electrode 18 as with the case where no over-etching is performed.

The following will describe a method of manufacturing the above-mentioned semiconductor device in a step-wise order with reference to FIGS. 3 to 5.

First, as shown in FIG. 3A, an element-isolating insulator film 2 consisting of a 200 to 300 nm-thick field oxide film is formed on for example a p-type silicon substrate 1 using a known LOCOS (Local Oxidation of Silicon) method and subsequently, in an active region surrounded by this element-isolating insulator film 2, a gate oxide film 4 which consists of an 8 to 15 nm-thick silicon oxide film is formed by a thermal oxidation method and subsequently, on this gate oxide film 4, a 200 to 300 nm-thick polycrystalline silicon film is formed by a CVD (Chemical Vapor Deposition) method and then patterned into the gate electrode 5 by a photolithographic method. Next, by a self-alignment method using the gate oxide film 4 and the gate electrode 5 as a mask, an n-type impurity is introduced into the silicon substrate using an ion implantation method or any other known impurity-introduction method, to form an n-type diffusion region to constitute a source or drain region therein.

Next, using the CVD method, the first inter-layer insulator film 6 consisting of a 100 to 150 nm-thick silicon oxide film is formed to cover the gate oxide film 4 and the gate electrode 5 and then, using the CVD method again, a polycrystalline silicon film is formed to connect the bit contact 8 to one diffusion region 3, to which bit contact 8 is then connected the bit line 30. Next, by the CVD method, the second inter-layer insulator film 7 consisting of a 400 to 500 nm-thick BPSG film is formed all over the surface and then patterned by the photolithographic method to form the contact hole 9 in the second inter-layer insulator film 7, into which contact hole 9 is buried the conducting plug 10 consisting of a polycrystalline silicon film for connection to the other diffusion regions 3. Thus, a memory-cell selection transistor is formed in the semiconductor device.

Next, as shown in FIG. 3B, using the CVD method, the third inter-layer insulator film 11 consisting of a 0.8 to 1.5 μm-thick silicon oxide film or BPSG film is formed all over the surface and then patterned using the photolithographic method to form the contact hole 12 with a width of 0.5 to 1.0 μm and a depth of 0.6 to 1.1 μm in the third inter-layer insulator film 11 in order to expose the conducting plug 10. At the same time, in order not to expose the conducting plug 10 at a position adjacent to the contact hole 12, the trench 13 is formed which has approximately the same depth as the contact hole 12. The contact hole 12 is used to form a capacitor, while the trench 13 is used to form a dummy capacitor.

Figure 4C:
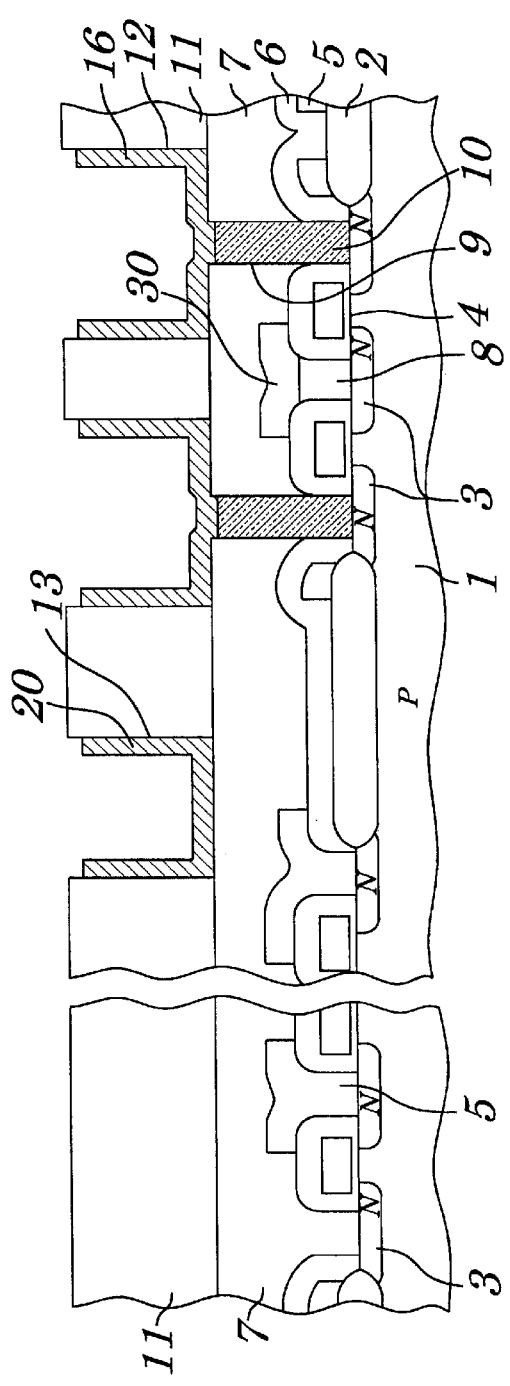
FIG. 4 is a subsequent flow diagram showing steps in order for manufacturing the semiconductor device.

Next, as shown in FIG. 4C, a 0.50 to 0.1 μm-thick polycrystalline silicon film is formed all over the surface by the CVD method and then patterned by the photolithographic method to form in the contact hole 12 the lower electrode 16 which constitutes a capacitor and, at the same time, the conductive film 20 which constitutes the lower electrode of a dummy capacitor, in the trench 13.

Figure 4D:
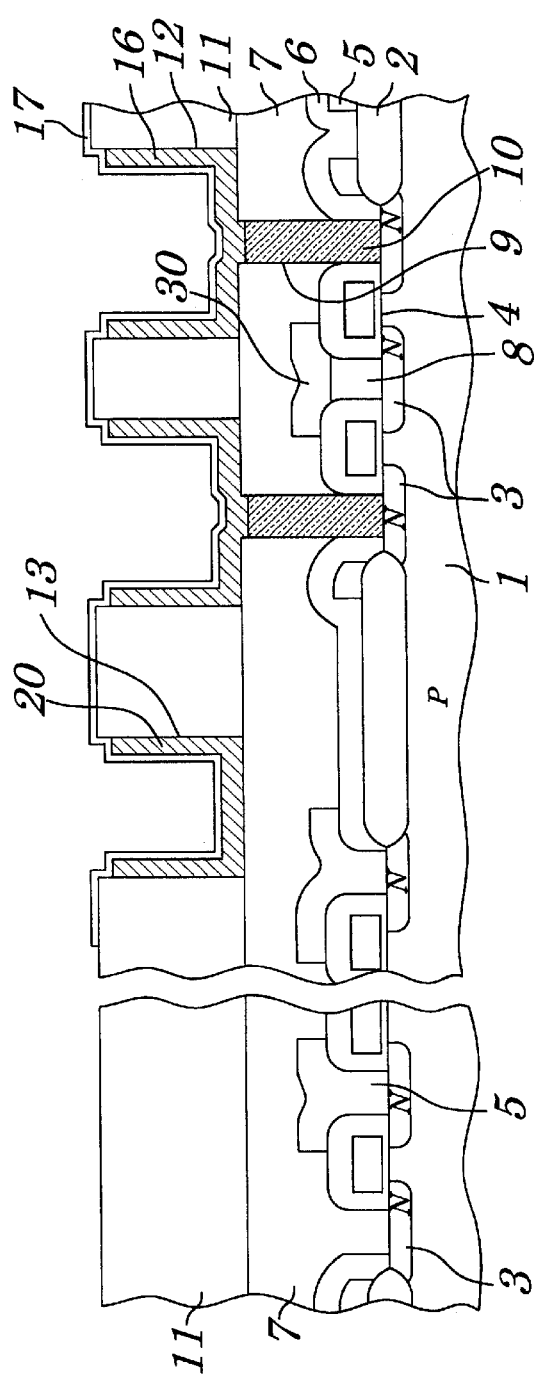

Next, as shown in FIG. 4D, using the CVD method, the capacitive insulator film 17 consisting of a 6 to 8 nm-thick ONO or ON film is formed and then patterned by the photolithographic method so as to straddle the lower electrode 18 and the conductive layer 20 in the contact hole 12 or the trench 13.

Figures 5E, 5F:
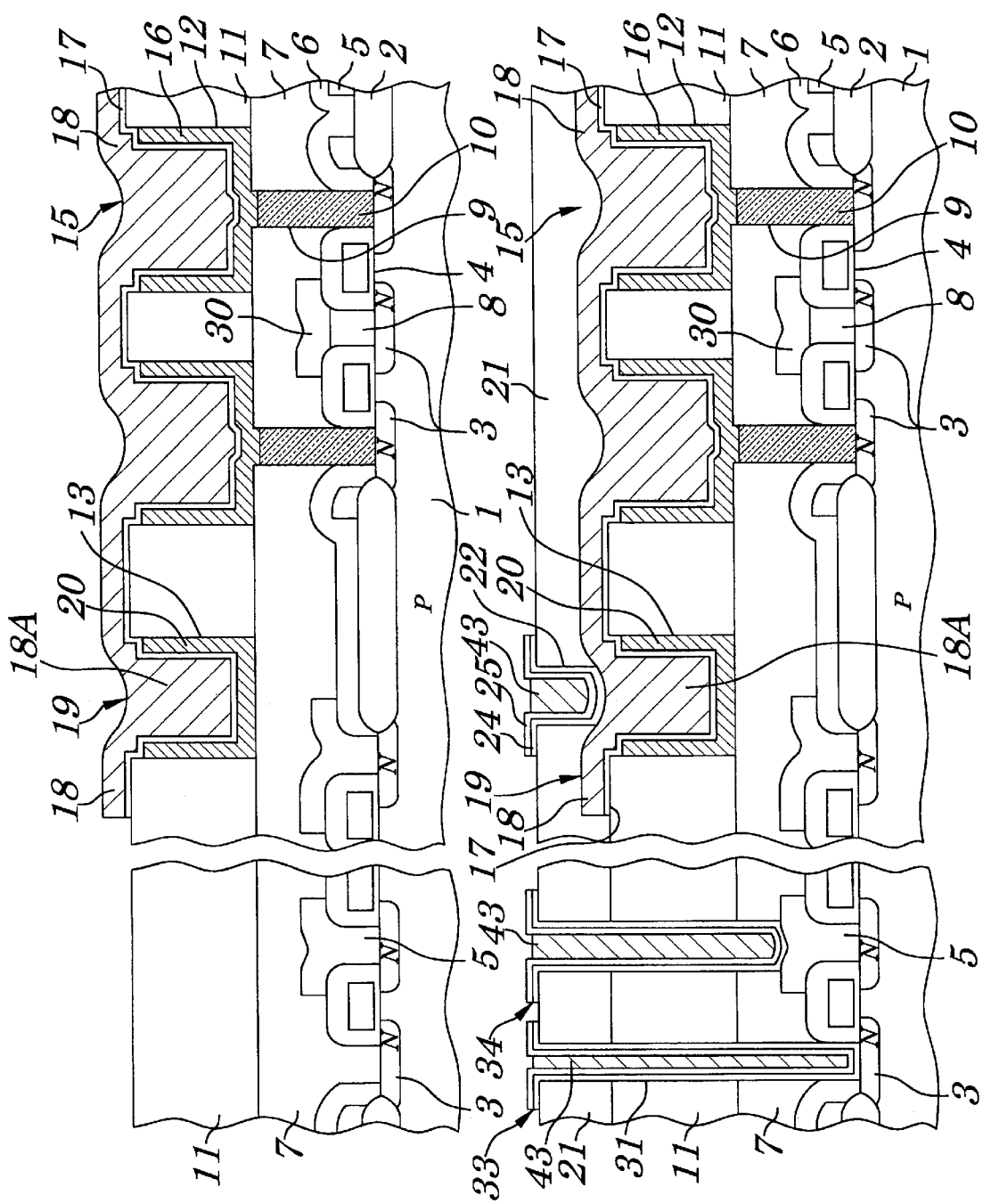
FIG. 5 is another subsequent flow diagram showing steps in order for manufacturing the semiconductor device.

Next, as shown in FIG. 5E, using the CVD method, a 0.15 to 0.3 μm-thick polycrystalline silicon film is formed and then patterned by the photolithographic method to form the upper electrode 18 on the capacitive insulator film 17. Thus, the capacitor 15 is formed in the contact hole 12 and the dummy capacitor 19, in the trench 13.

Next, as shown in FIG. 5F, using the CVD method, the fourth inter-layer insulator film 21 consisting of 0.35 to 0.55 μm-thick silicon oxide film or BPSG film is formed and patterned by the photolithographic method to form the contact hole 22 with a width of 0.35 to 0.55 μm and a depth of 0.3 to 0.6 μm in the trench 13 above the trench 13 in order to expose the upper electrode 18 of the capacitor 15. At the same time, the contact holes 31 and 32 are formed in other positions on the semiconductor substrate 1, i.e., the diffusion region 3 and the gate electrode 5 respectively.

Next, using a sputtering method, the barrier metal films 23, 33, and 34 each consisting of the 80 to 150 nm-thick titanium film 24 and the 70 to 150 nm-thick titanium nitride 25 are formed in the contact holes 22, 31, and 32 respectively. Then, heat treatment is conducted to cause the titanium film 24 of the barrier metal film and polycrystalline silicon of the upper electrode 18 to reach with each other, thus forming titanium silicide at an interface therebetween. During this silicide reaction, the polycrystalline silicon film which constitutes the upper electrode 18 is buried with a sufficient film thickness as against the film thickness of the titanium film 24 formed on the bottom of the contact hole 22, thus avoiding insufficiency in supply of polycrystalline silicon.

Next, using the sputtering method, on the barrier metal films 23, 33, and 34 are sequentially formed the conducting plug 43 made of tungsten, the wirings 26, 35, and 36 consisting of a 250 to 450 nm-thick aluminum, and the reflection-preventing films 27, 37, and 38 consisting of a 25 to 30 nm-thick titanium nitride film, thus completing the semiconductor device according to this embodiment.

Thus, according to the configuration of this embodiment, the contact hole 22 is formed in the fourth inter-layer insulator film 21 covering the upper electrode 18 of the capacitor 15, to expose part of the upper electrode 18, below which contact hole 22 is formed the trench 14 larger than the contact hole 22 in width which is covered by the capacitive insulator film 17 formed in the trench 13, in which trench 14 is provided the polycrystalline silicon film 18A which constitutes the upper electrode 18, so that there is no insufficiency in supply of polycrystalline silicon at the time of silicide reaction between polycrystalline silicon of the upper electrode 18 and titanium of the barrier metal film 23.

Therefore, at the time of the silicide reaction, the occurrence of voids which is likely at the polycrystalline silicon wiring can be suppressed, to reduce and stabilize contact resistance.

Second Embodiment

A configuration of a semiconductor device according to this embodiment differs largely from that of the above-mentioned first embodiment in a respect that an aspect ratio (contact depth/contact width) of the contact hole is increased by forming a wider trench.

Figure 6:
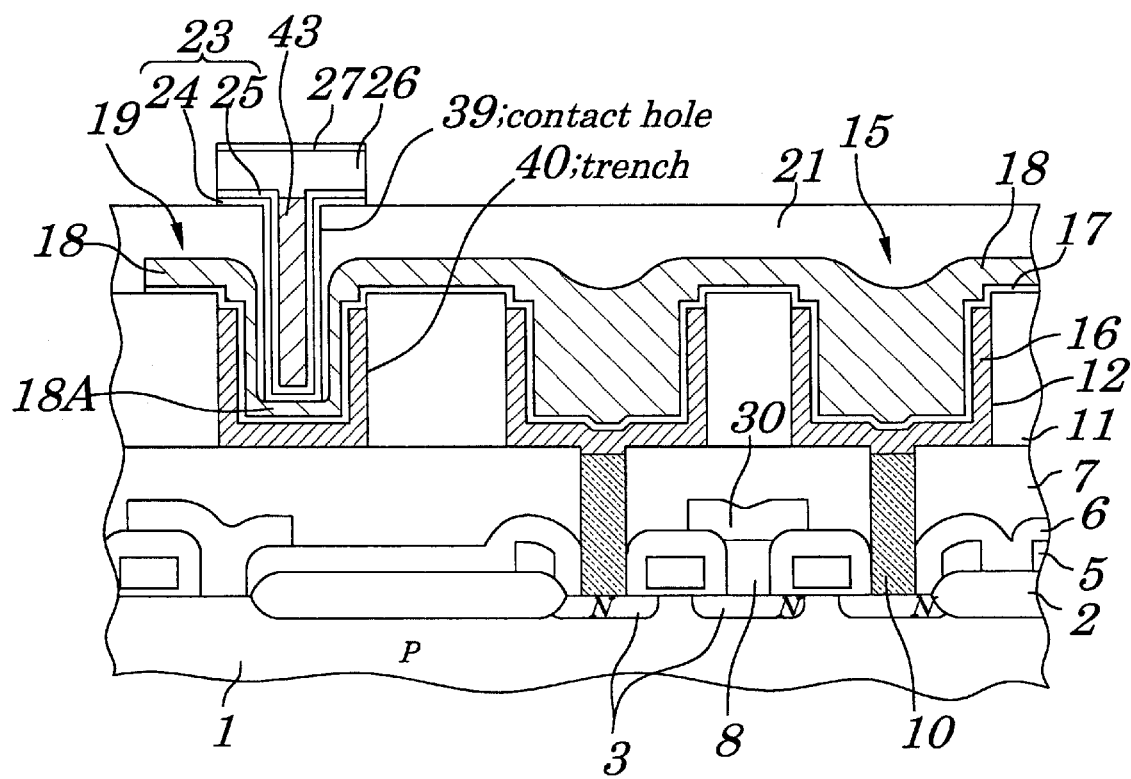
FIG. 6 is a cross-sectional view showing a configuration of a semiconductor device according to a second embodiment of the present invention.

As shown in FIG. 6, a trench 40 provided to form a dummy capacitor in the third inter-layer insulator film 11 is formed as thick as 0.8 to 1.5 µm, wider than the trench 13 in the first embodiment. With this, the polycrystalline silicon film 18A which constitutes the upper electrode 18 is not fully buried in the trench 40, so that the titanium film 24 of the barrier metal film 23 formed at the bottom of the contact hole 39 formed through the third inter-layer insulator film 11 is formed relatively thin.

That is, the titanium film 24 is thus formed thin as against the polycrystalline silicon film 18A, to require only a little quantity of polycrystalline silicon at the time of the silicide reaction, thus successfully suppressing the occurrence of voids due to an insufficiency in supply of polycrystalline silicon. Also, since the polycrystalline silicon film 18A which provides the upper electrode 18 in the trench 40 is formed thin, to obtain a larger aspect ratio, thus being advantageous in the formation of fine-pattered wirings.

The semiconductor device according to this embodiment can be manufactured through approximately the same steps as the first embodiment. When formed in the third inter-layer insulator film 11, the trench 40 can be formed wider only by changing the size of patterns for a photo-resist film.

The other steps are approximately the same as the above-mentioned first embodiment. Therefore, in FIG. 6, the parts corresponding to those in FIGS. 1 and 2 are indicated by the same reference numerals as in FIGS. 1 and 2, so their description is omitted here.

Thus, the configuration according to this embodiment provides approximately the same effects as those by the above-mentioned first embodiment.

In addition, according to that configuration of this embodiment, the polycrystalline silicon film of the upper electrode of the capacitor can be formed relatively thin, thus contributing to decreases in the aspect ration of the contact hole.

Third Embodiment

A configuration of a semiconductor device according to this embodiment differs largely from the above-mentioned first embodiment in a respect that in contrast to the first embodiment with a configuration, in which a capacitor is placed above a bit line, in the construction of the third embodiment the capacitor is placed below the bit line and also a side-wall insulator film is formed on the side wall of a contact hole so as to fit a fine-patterned structure.

Figure 7:
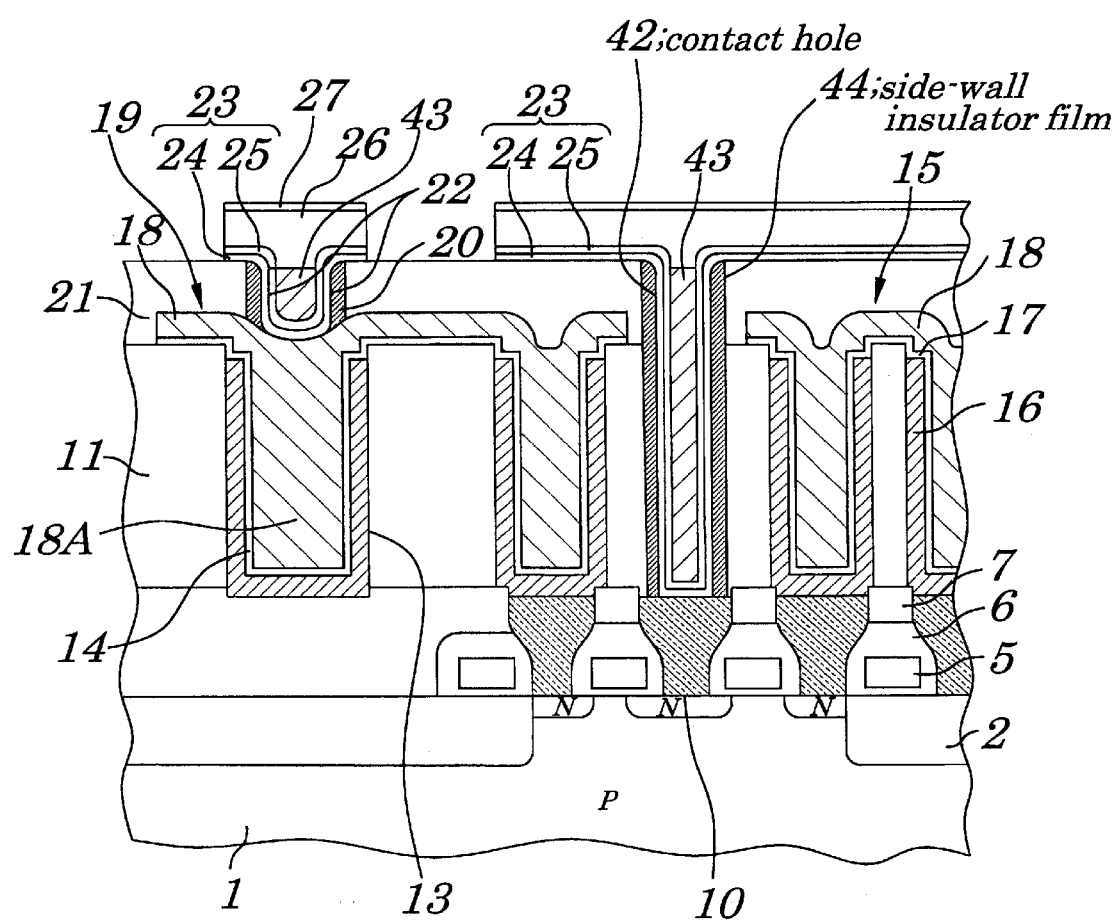
FIG. 7 is a cross-sectional view showing a configuration of a semiconductor device according to a third embodiment of the present invention.
Figure 8:
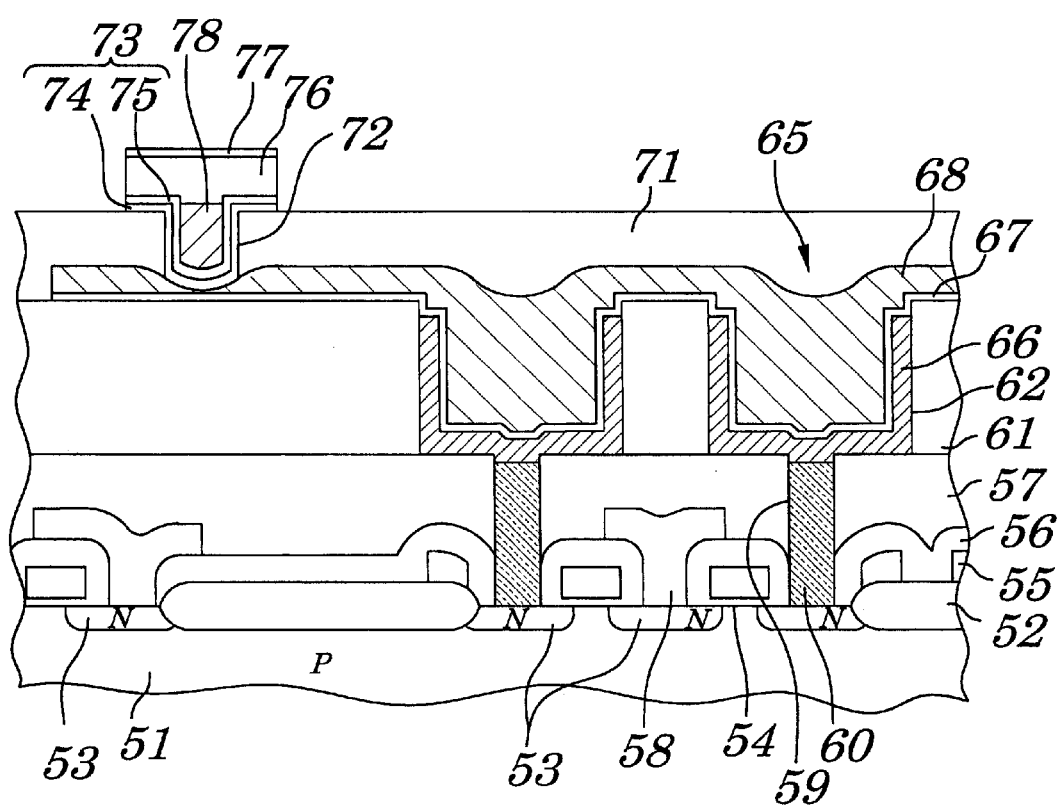
FIG. 8 is a cross-sectional view showing a configuration of a conventional semiconductor device.
Figure 9A:
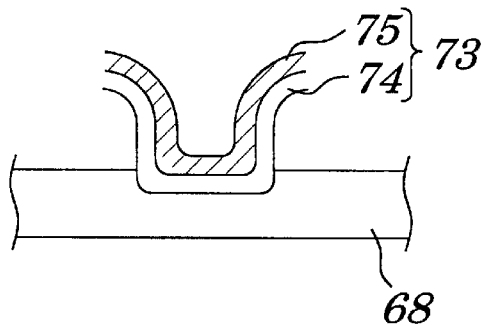
FIG. 9 illustrates a defect of the conventional semiconductor device.
Figure 9B:
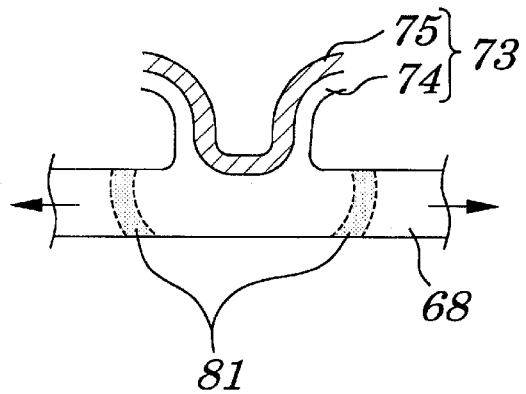
Figure 10:
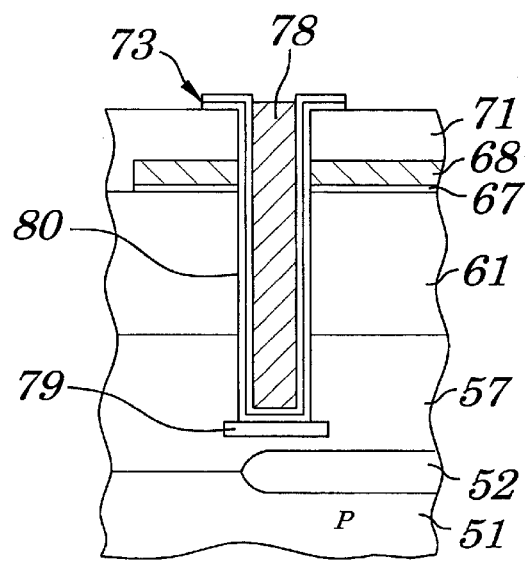
FIG. 10 is a cross-sectional view showing a configuration of the conventional semiconductor device.

In the semiconductor device according to this embodiment, as shown in FIG. 7, on the side wall of a contact hole 42 formed to expose the conducting plug 10 connected to one diffusion region 3 is provided a side-wall insulator film 44 consisting of a silicon oxide or silicon nitride film. And the conducting plug 10 is connected via the contact hole 42 and the barrier metal film 23 to a bit line consisting of a tungsten-made conducting plug 43, an aluminum-made wiring 47, and a reflecting-preventing film 48. A side-wall insulator film 44, provided also on the side wall of the contact hole 22, is formed at the same time as the side-wall insulator film 44 is formed, so not always necessary.

In the configuration according to this embodiment, even in such a fine-patterned structure as shown in FIG. 7 in which for example the upper electrodes 18 of the capacitor 15 are provided near each other, even when the contact hole 42 is mis-aligned with respect to the upper electrode 18 during photolithographying in a manufacturing step and a resultant shift has brought the upper electrode 18 near the conducting plug 43, the presence of the side-wall insulator film 44 can keep an electrical connection therebetween.

Also, since the width of the trench 14 covered with the capacitive insulator film 12 formed in the trench 13 in which the dummy capacitor 19 is formed is made larger than that of the contact hole 22, even if the contact hole 22 is so over-etched as to reach the height of the capacitive insulator film 12, the upper electrode 18 above the third inter-layer insulator film 11 is not separated from the polycrystalline silicon region 18A formed in the trench 14, to prevent poor continuity of the wiring, thus causing no problems with an electrical connection between the wiring 26 and the upper electrode 18 even when the side-wall insulator film 44 is formed on the side wall of the contact hole 22.

Thus, with this configuration according to this embodiment, it is possible to obtain approximately the same effects as those described with the first embodiment.

In addition, this configuration according to this embodiment makes it possible to prevent a short circuit between wirings near each other, thus being advantageous in a fine-patterned structure.

It is thus apparent that the present invention is not limited to the above embodiments but may be changed and modified without departing from the scope and spirit of the invention. For example, the capacitive insulator film employed is not limited to ONO and ON films but may come in a tantalum oxide film, BST (BaSr)TiO3 film, PZT (Pb(ZrTi)O3 film, etc. Also, as far as capacitors are provided on a semiconductor substrate, the present invention applies not only to DRAMs but also to a standalone capacitor.

Also, the gate oxide film employed is not limited to an oxide film but may come in a nitride film or a double-structured film combining an oxide film and a nitride film. That is, as far as it is of an MIS type, the transistor of interest is not limited to an MOS type one but may come in an MNS (Metal Nitride Semiconductor) type one or an MNOS (Metal Nitride Oxide Semiconductor) type one. Also, the conductivity type in each semiconductor region may be inverted between p and n types. That is, the present invention applies not only to an n-type channel transistor but also to a p-type channel MIS transistor. Also, although only one example has been described above for each of the insulator film, the thickness of conductive films, the number of stacked layers, and the method for forming these films, they may be changed depending on applications and purposes.

Finally, the present application claims the priority of Japanese Patent Application No. Heill-036544 filed on Feb. 15, 1999, which is herein incorporated by reference.

What is claimed is:

1. A method of manufacturing a semiconductor device, comprising the steps of:

forming a diffusion region in a semiconductor substrate and then connecting a conducting plug to said diffusion region, to form a memory-cell selecting transistor;

forming a first insulator film so as to cover said conducting plug and then forming a second contact hole in said first insulator film so as to expose said conducting plug and, at the same time, forming a trench so as not to expose said plug;

forming a conductive film in said second contact hole and said trench simultaneously, to constitute a lower electrode of a capacitor and a lower electrode of a dummy capacitor;

forming capacitive insulator film so as to cover both of said electrodes and then forming an upper electrode made of polycrystalline silicon on said capacitive insulator film to form a capacitor and a dummy capacitor;

forming a second insulator film so as to cover said upper electrode of said capacitor and then forming a first contact hole smaller in width than a second trench covered with said capacitive insulator film formed in said trench, in said second insulator film so as to expose said upper electrode of said dummy capacitor and, at the same time, forming a third contact hole which differs in depth from said first contact hole, in an insulator film which includes said first insulator film and said second insulator film;

forming a barrier metal film which has an underlying film made of titanium, in such a way that a titanium film which has a film thickness corresponding to a film thickness of a polycrystalline silicon region formed in said trench by polycrystalline silicon of said upper electrode is formed at a bottom of said first contact hole; and conducting heat treatment of reacting titanium of said underlying film of said barrier metal film and polycrystalline silicon of said upper electrode.

2. The method of manufacturing a semiconductor device according to claim 1, wherein in said capacitor-forming step, said upper electrode is formed in such a way that polycrystalline silicon of said upper electrode is fully buried in said trench.

3. The method for manufacturing a semiconductor device according to claim 1, wherein in said capacitor-forming step, said upper electrode is formed in such a way that polycrystalline silicon is not fully buried in said trench and, at the same time, said first contact hole is so formed as to reach a bottom of said trench.

4. The method for manufacturing a semiconductor device according to claim 1, further comprising a step of forming a side-wall insulator film on said first side wall and said third wall after said contact hole-forming step.

* * * * *